United States Patent [19]

Okutsu et al.

[11] Patent Number: 4,733,106
[45] Date of Patent: Mar. 22, 1988

[54] CAPACITIVE LOAD DRIVING DEVICE

[75] Inventors: Mitsuhiko Okutsu, Katsuta; Tatsuo Shimura, Hitachi; Tadaaki Kariya, Ibaraki, all of Japan

[73] Assignees: Hitachi, Ltd.; Hitachi Engineering Co., both of Japan

[21] Appl. No.: 718,283

[22] Filed: Apr. 1, 1985

[30] Foreign Application Priority Data

Mar. 30, 1984 [JP] Japan ................................. 59-65015

[51] Int. Cl.$^4$ ............................................. H03K 3/26
[52] U.S. Cl. ................................... 307/270; 307/631; 307/246
[58] Field of Search ................... 307/246, 252 B, 270; 328/67; 330/255, 262

[56] References Cited

U.S. PATENT DOCUMENTS

| | | | |
|---|---|---|---|
| 3,097,335 | 7/1963 | Schmidt | 307/252 G |
| 3,404,291 | 10/1968 | Green et al. | 307/246 |
| 3,564,287 | 2/1971 | Todd | 307/246 |
| 4,070,589 | 1/1978 | Martinkovic | 328/67 |
| 4,572,969 | 2/1986 | Hellegaard et al. | 307/246 |

Primary Examiner—Stanley D. Miller
Assistant Examiner—B. P. Davis
Attorney, Agent, or Firm—Antonelli, Terry & Wands

[57] ABSTRACT

A device for driving a capacitive load, comprising a first switching element responsive to an external control signal for selectively conducting a charge current therethrough to the load, a second switching element responsive to the external control signal for conducting a discharge current from the load and a generator for generating from the discharge current a cutoff signal to be applied to the first switching element to ensure turn-off of the latter.

13 Claims, 8 Drawing Figures

FIG. 5A
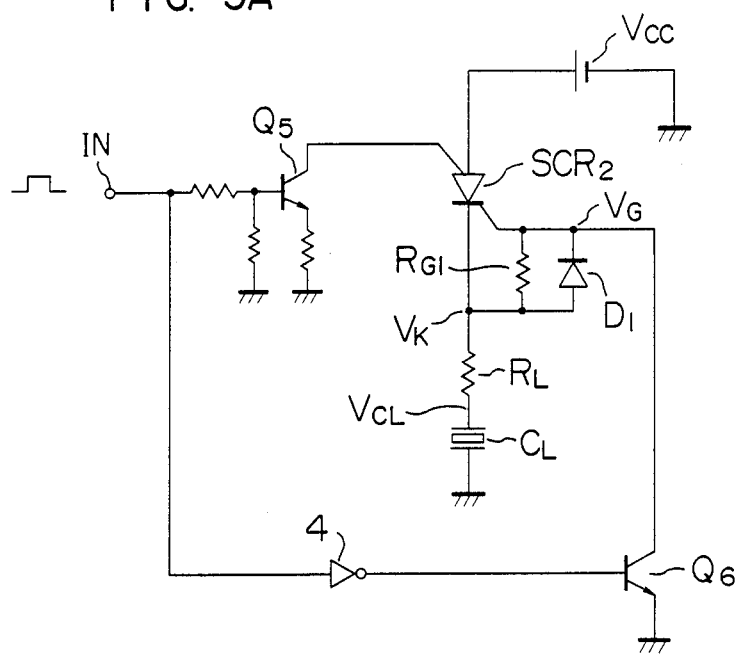
FIG. 5B
FIG. 5C
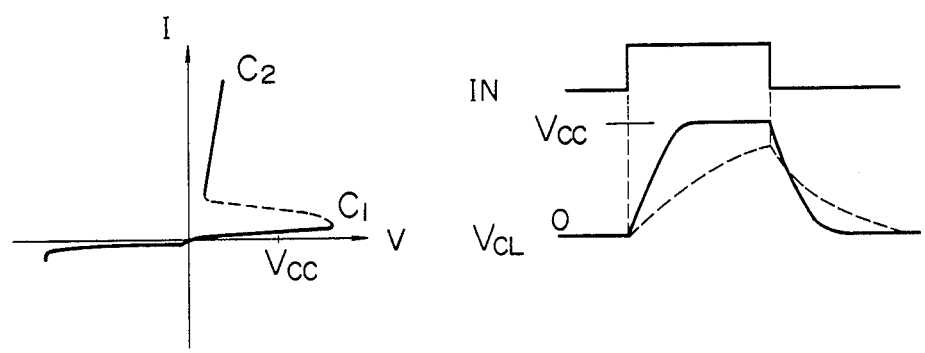

CAPACITIVE LOAD DRIVING DEVICE

BACKGROUND OF THE INVENTION

This invention relates to a device for driving a capacitive load.

An example of such a capacitive load is a piezoelectric element employed in the printing head of an ink-jet printer. The piezoelectric element in the printing head is supplied with an input pulse signal so that the element is driven for compression and expansion to compress and expand in ink container or chamber containing ink to emit ink droplets in accordance with the input signal. For actuation of the piezoelectric element, a voltage is applied to the element to deform the latter and then the applied voltage is removed or restored to 0 V to take out charges accumulated in the element applied thereto so that the element resumes its original state. The voltage is reapplied to the element and removed therefrom to repeat this cycle. Electrically, this cycle for the compression/expansion drive of the piezoelectric element is accompanied with the charge/discharge operation of the element.

Thus, reference will be made to the case where the capacitive load to be driven is, for example, a piezoelectric element.

A piezoelectric element can be regarded to be equivalent to a capacitor inasmuch as it is a capacitive element, and, for the purpose of driving such an element, a charging circuit and a discharging circuit are required for controlling the timing of charging and discharging the element. FIG. 1 shows, by way of example, the basic structure of a driving device of this kind. Referring to FIG. 1, the driving device may include a control circuit 1, a charging switch $S_1$, a discharging switch $S_2$, a resistor $R_L$, a capacitive load or piezoelectric element $C_L$, and a power source $V_{cc}$. In response to the application of a first control signal from the control circuit 1, the charging switch $S_1$ is turned on, and the piezoelectric element $C_L$ is charged by the power source $V_{cc}$. For discharging the piezoelectric element $C_L$, on the other hand, the control circuit 1 applies a second control signal for turning off the charging switch $S_1$ and turning on the discharging switch $S_2$.

FIG. 2 shows the structure of a practical form of the device in which transistors $Q_1$ and $Q_2$ connected at their bases with a driver 2 are used as the charging and discharging switches $S_1$ and $S_2$, respectively. In the strucure shown in FIG. 2, the NPN transistor $Q_1$ is turned on to charge the piezoelectric element $C_L$, while, the PNP transistor $Q_2$ is turned on (with simultaneous turn-off of the transistor $Q_1$) to discharge the piezoelectric element $C_L$. The resistor $R_L$ in FIGS. 1 and 2 serves to determine along with the element $C_L$ the time constant for charging and discharging operations of the element.

When the transistors $Q_1$ and $Q_2$ are used to drive the piezoelectric element $C_L$ in the manner shown in FIG. 2, the base current must be continuously supplied to the transistor $Q_1$ or $Q_2$ throughout the period of charging or discharging the piezoelectric element $C_L$ driven by the driving signal applied from the driver 2. Consider now, for example, the transistor $Q_1$. When the transistor $Q_1$ is turned on the start charging of the load $C_L$, the emitter potential $V_o$ of the transistor $Q_1$ rises sharply up to about the level of $V_{cc}$ due to the turn-on of the transistor $Q_1$. On the other hand, the charge current flows, attenuating according to the time constant determined by the combination of $C_r$ and $R_L$. The transistor $Q_1$ must be kept turned on until this charge current ceases to flow. Although the base current must be continuously supplied to maintain the on-state of the transistor $Q_1$, this base current is now supplied from the power source $V_{cc}$ due to the rise of the emitter potential $V_o$ up to about the level of $V_{cc}$. Thus, when the transistors are driven with a TTL level signal, a path is necessarily formed through which the driving current flows from the power source $V_{cc}$ toward the ground. Such an example is shown in FIG. 3 which illustrates the charging section only.

Referring to FIG. 3, there are provided a PNP transistor $Q_3$ for driving the transistor $Q_1$ and an NPN transistor $Q_4$ for driving the transistor $Q_3$. The transistor $Q_4$ operates in response to an input signal IN (of TTL level) and acts as a constant-current circuit so as to limit the current supplied from the power source $V_{cc}$. The base current $I_D$ of the transistor $Q_3$ is supplied from the power source $V_{cc}$ to the ground for turning on the transistor $Q_1$. The value of this current $I_D$ must be sufficient to permit operation of the transistor $Q_1$ in its saturation region. Since the transistor $Q_4$ operates in the active region, and the voltage value of the power source $V_{cc}$ is usually as large as about 100 V to 300 V. The power loss at the transistor $Q_4$ becomes a serious problem especially when, for example, the operating frequency is high or the on-duration is long. Even when the transistor $Q_1$ is replaced by a PNP transistor, a problem similar to that described above still remains unsolved insofar as such a transistor is included in the device.

With a view to obviate the problem pointed out above, a proposal, as, for example, disclosed in Japanese Patent Application Laid-open No. 221517/83, laid-open on Dec. 23, 1983 has been made and already known, in which the transistor $Q_1$ shown in FIG. 3 is replaced by a thyristor. FIG. 4 shows a structure of a device which employs a thyristor $SCR_1$ in place of the transistor $Q_1$. Employment of the thristor $SCR_1$ is advantageous in that the power consumption can be reduced since the minimum firing current $I_{gt}$ of the thyristor is small (or usually in the order of 0.1 mA), and the driving current need not be continuously supplied once the thyristor $SCR_1$ is fired or turned on. In this case, however, it is necessary to turn on the discharging transistor $Q_2$ after the charging thyristor $SCR_1$ has completed a charging operation and turn-off of the thyristor has been detected. This is because, otherwise, the thyristor $SCR_1$ would be continuously turned on. Therefore, when a thyristor is used as the charging switch, the upper limit of the operating frequency is determined by the time constant of the load current and the turn-off time of the thyristor. Also, the device cannot be operated in such a way as to permit starting of discharge midway of charging.

SUMMARY OF THE INVENTION

It is a primary object of the present invention to provide a device for driving a capacitive load, in which power consumption can be reduced without requiring a complex circuit structure and the capacitive load can be charged and discharged at a high speed.

The present invention is featured by the fact that a switching element is provided in a charging path charging a capacitive load, while, in a discharging path discharging the capacitive load, a switch is provided together with a cutoff circuit generating a cutoff signal to be applied to the switching element to ensure turn-off of the switching element, so that the capacitive load can be driven at a high speed without the necessity for provision of an extra circuit such as a detection circuit detecting turn-off of the switching element.

The driving apparatus of the present invention may be used not only with the above-mentioned piezoelectric element, but also with any aother capacitive loads that should be driven at a high speed for charge/discharge operations.

BRIEF DESCRIPTION OF THE DRAWINGS

FIG. 5A is a circuit diagram showing the structure of an embodiment of the present invention.

FIG. 5B is a characteristic curve of the thyristor used in the embodiment of FIG. 5A.

FIG. 5C shows waveforms of the input signal and the terminal voltage of the capacitive load.

DESCRIPTION OF THE PREFERRED EMBODIMENTS

Figure 1:
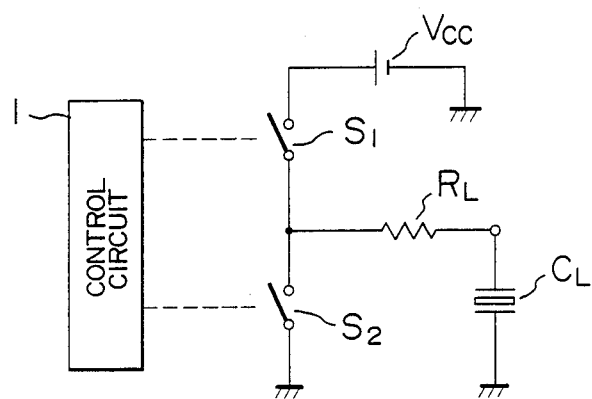
FIG. 1 is a circuit diagram illustrating the principle of operation of a capacitive load driving apparatus.
Figure 2:
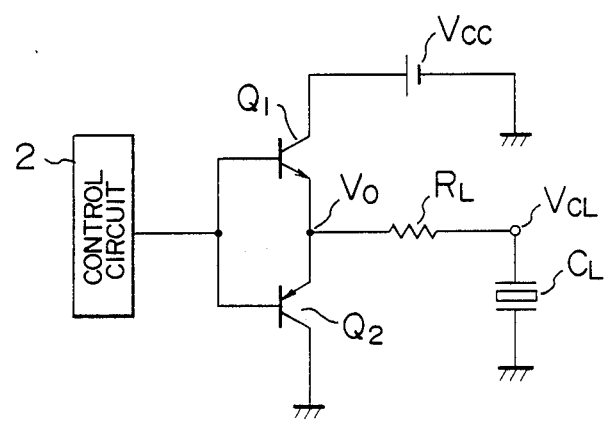
FIGS. 2 to 4 are circuit diagrams of prior art driving apparatus.
Figure 3:
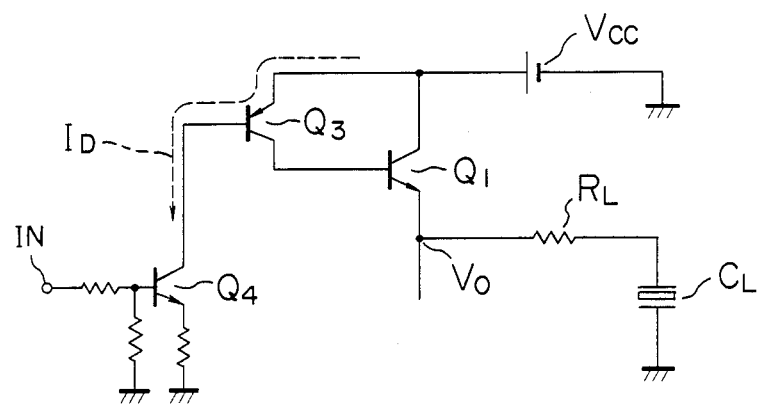
Figure 4:
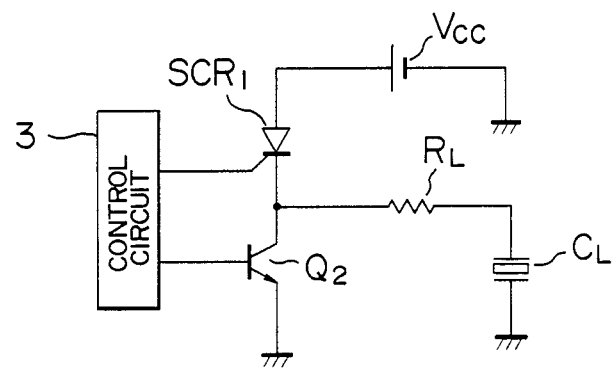

FIG. 5A shows an embodiment of the device according to the present invention. Referring to FIG. 5A, a unidirectional tetrode thyristor $SCR_2$ is provided for charging a piezoelectric element $C_L$ and is connected at its anode with a power source $V_{cc}$ and at its cathode with the piezoelectric element $C_L$, which is a capacitive load, through a resistor $R_L$. The thyristor $SCR_2$ may have, for example, such a current vs. voltage characteristic as shown in FIG. 5B. The voltage to be applied to the load $C_L$ rises and falls depending upon the time constant $R_L \cdot C_L$. Without the resistor $R_L$, the rise and fall of the voltage would be determined by the switching speed of the thyristor $SCR_2$. Another resistor $R_{G1}$ is connected across the cathode gate and the cathode of the thyristor $SCR_2$ for setting or defining the minimum firing current $I_{gt}$ and maintaining the withstand-voltage reliability. A diode $D_1$ is also connected across the cathode gate and the cathode of the thyristor $SCR_2$ for forming a discharge path for the piezoelectric element $C_L$, and a discharging NPN transistor $Q_6$ is connected with the cathode gate of the thyristor $SCR_2$. In order that the thyristor $SCR_2$ can be easily triggered even when the cathode potential $V_K$ of the thyristor $SCR_2$ is not dripped to the ground potential level, the thyristor $SCR_2$ is arranged for the anode-gate drive, and an NPN transistor $Q_5$ amplifying an external control pulse signal IN is connected with the anode gate of the thyristor $SCR_2$ for driving the anode gate with a constant current. The discharging transistor $Q_6$ operates in response to an output of an inverter 4 which inverts the control signal IN.

The operation of the embodiment shown in FIG. 5A will now be described with reference to FIGS. 5A to 5C.

In FIG. 5A, when the transistor $Q_5$ is non-conductive with the control signal IN being at a low level, the thyristor $SCR_2$ is non-conductive since no gate current is supplied to the cathode gate. Hence, the thyristor $SCR_2$ is operative along curve $C_1$, blocking the voltage $V_{cc}$ as shown in FIG. 5B. The control signal IN is now made to be at a high level in order to charge the piezoelectric element $C_L$. The transistor $Q_5$ is turned on with the transistor $Q_6$ being turned off, so that a current is taken out from the anode gate of the thyristor $SCR_2$ to turn it on. Thus, the thyristor $SCR_2$ is now operative along curve $C_2$ (FIG. 5B), allowing a charge current to flow from the power source $V_{cc}$ to the element $C_L$ through the thyristor $SCR_2$. While the drive current flows continuously throughout the on-duration of the charging thyristor $SCR_2$, the value of this drive current need not be large and is such that it is merely larger than that of the minimum firing current $I_{gt}$ of the thyristor $SCR_2$. Thus, the power consumption is low.

For the purpose of discharging the piezoelectric element $C_L$, the external control signal IN is returned to its low level thereby turning on the transistor $Q_6$ with the transistor $Q_5$ being turned off. Since the transistor $Q_6$ is operating in its saturation mode at this time, a discharge current flows from the piezoelectric element $C_L$ through the route of $C_L \rightarrow R_L \rightarrow D_1 \rightarrow Q_6$, and, at the same time, the cathode gate potential $V_G$ of the thyristor $SCR_2$ drops substantially to the level of the ground potential. At this time, a forward voltage drop providing a cutoff signal occurs across the diode $D_1$, and the cathode potential $V_K$ of the thyristor $SCR_2$ becomes higher than the cathode gate potential $V_G$ by the amount corresponding to about the forward voltage drop across the diode $D_1$, resulting in such a state that the cathode gate and cathode of the thyristor $SCR_2$ are reverse biased. Consequently, even if the thyristor $SCR_2$ might be maintained in its on state to continue to supply the charge current, the current flowing through the thyristor $SCR_2$ is taken out through the cathode gate to be operative along the curve $C_1$ (FIG. 5B), finally causing turn-off of the thyristor $SCR_2$.

It will be seen that, according to the embodiment shown in FIG. 5A, it is possible to drive the load at an increased speed and to reduce the power consumption without complicating the structure of the circuit.

FIG. 5C shows an example of an external control input pulse signal IN and the terminal voltage $V_{CL}$ of the load $C_L$. The dotted curve shows a case in which the load $C_L$ is discharged before being charged to $V_{cc}$.

Figure 6:
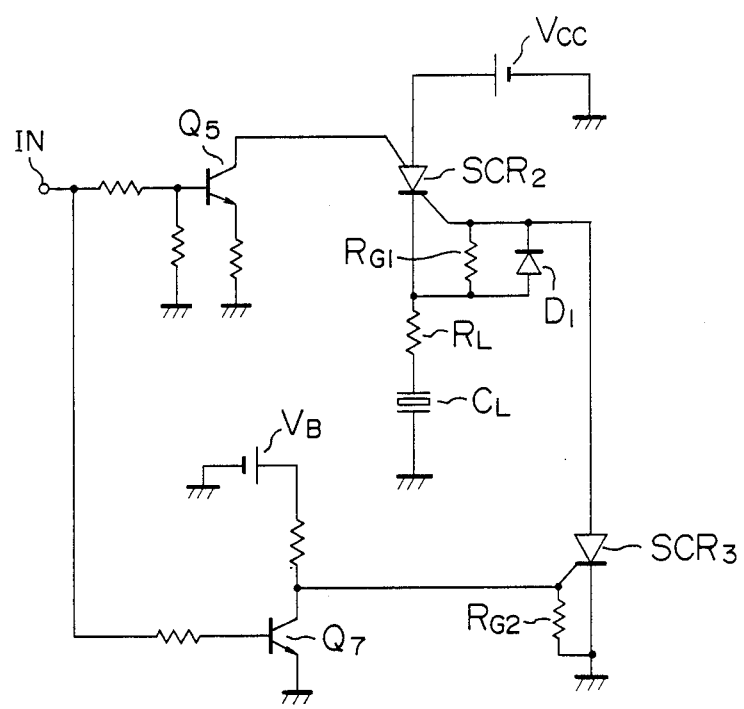
FIG. 6 is a circuit diagram showing the structure of another embodiment of the present invention.

FIG. 6 shows another embodiment of the device according to the present invention. The embodiment shown in FIG. 6 is a partial modification of that shown in FIG. 5A in that the discharging tasnsistor $Q_6$ in the latter is replaced by a unidirectional triode thyristor $SCR_3$. An NPN transistor $Q_7$ is provided for triggering the thyristor $SCR_3$.

With the external control input pulse signal at a high level applied to the transistor $Q_5$, charging of the piezoelectric element is carried out in a manner similar to what has been described with respect to FIG. 5A embodiment. At this time the transistor $Q_7$ is conductive to short-circuit the gate of the thyristor $SCR_3$ to its cathode with a result that the thyristor is caused to remain non-conductive. Now, the control signal is made to be at a low level to turn off the transistors $Q_5$ and $Q_7$, so that a gate current is supplied from the power sourve $V_B$ to the gate of the thyristor $SCR_3$ to turn it on. This turn-on of the thyristor $SCR_3$ allows discharge of the piezoelectric load through the diode $D_1$ and causes a forward voltage drop thereacross, which will be a reverse bias making the potential of the cathode of the thyristor $SCR_2$ higher than that of the cathode gate. As a result, even if the thyristor $SCR_2$ remained conductive to pass some current therethrough, such current would be taken out through the cathode gate to the thyristor $SCR_3$ to finally turn off the thyristor $SCR_2$. Turn-off of the thyristor $SCR_3$ is effected by attenuation of the discharge current or by making the transistor $Q_7$ conductive. While the thyristor $SCR_3$ is in its on state, the cathode gate of the thyristor $SCR_2$ is biased at about the ground potential. Therefore, application of a triggering input to the thyristor $SCR_2$ would not turn on the thyristor $SCR_2$, which prevents undesirable flow of a short-circuit current through the route of $V_{cc} \rightarrow SCR_2 \rightarrow SCR_3$. In the embodiment shown in FIG. 5A, a drive current of a value enough to cause operation of the discharging transistor $Q_6$ in its saturation mode is required. In contrast, in the case of the embodiment shown in FIG. 6, a current of a value equal to about the minimum firing current $I_{gt}$ of the $SCR_3$ is merely required for turning on the thyristor $SCR_3$, and, thus, the power consumption is made lower than in the case of FIG. 5A. In FIG. 6, a resistor $R_{G2}$ is connected across the cathode gate and the cathode of the thyristor $SCR_2$ for setting or defining the minimum firing current $I_{gt}$ of the thyristor $SCR_2$.

Although the power source $V_{cc}$ employed in the aforementioned embodiments of the present invention is a positive voltage source, a negative power source may be employed along with a negative external control input pulse signal for driving the capacitive load. In such a case, it is apparent that the polarity of the transistors $Q_5$, $Q_6$ and $Q_7$ be reversed, the negative power source $V_{cc}$ and the load $C_L$ be connected with the cathode and anode of the $SCR_3$, respectively, and the diode $D_1$ be connected between the anode gate and the anode of the $SCR_2$, with the collector of the transistor $Q_5$ connected with the cathode gate of the thyristor $SCR_2$.

We claim:

1. A device for driving a capacitive load in response to an external control signal, comprising:
   charging circuit means being connectable with the capacitive load for charging the latter and including a switching element, said switching element being arranged to be rendered electrically conductive to supply a charge current to the capacitive load when the device receives said control signal; and
   discharging circuit means connectable with the capacitive load for discharging the latter with a discharge current passing therethrough when said control signal ceases, said discharging circuit means including means for generating a cutoff signal from said discharge current and applying the cutoff signal to said switching element to ensure turn-off of said switching element, in which said switching element is constituted by a unidirectional tetrode thyristor having an anode connectable with a power source, a cathode connectable with the capacitive load, a first gate for receiving said control signal and a second gate, and said cutoff signal generating means is constituted by a diode having its anode connected with the cathode of said thyristor and its cathode connected with said second gate.

2. A device according to claim 1, in which said discharging circuit means further includes a switch connected with the cathode of said diode and operable to be electrically non-conductive when said control signal exists and electrically conductive when said control signal ceases.

3. A device according to claim 2, in which said switch is constituted by a transistor.

4. A device according to claim 2, in which said switch is constituted by a unidirectional tetrode thyristor.

5. A switching circuit for a capacitive load, comprising:
   a thyristor having a gate, and a cathode, responsive to an external control signal to selectively conduct a charge current to the capacitive load;
   a switch responsive to said external control signal to conduct a discharge current from the capacitive load; and
   means connected with said thyristor and passing therethrough said condcuted discharge current to generate therefrom a cutoff signal to be applied to said thyristor to ensure turn-off of the latter.

6. A device for driving a capacitive load in response to an external control signal, comprising:
   charging circuit means being connectable with the capacitive load for charging the latter and including a switching element, said switching element being arranged to be rendered electrically conductive to supply a charge current to the capacitive load when the device receives said control signal; and
   discharging circuit means connectable with the capacitive load for discharging the latter with a discharge current passing therethrough when said control signal ceases, said discharging circuit means including means for generating a cutoff signal from said discharge current and applying the cutoff signal to said switching element to ensure turn-off of said switching element, in which said switching element is constituted by a unidirectional tetrode thyristor having a cathode connectable with a power source, an anode connectable with the capacitive load, a first gate and a second gate for receiving said control signal, and said cutoff signal generating means is constituted by a diode having its anode connected with the first gate of said thyristor and its cathode connected with the anode of said thyristor.

7. A device according to claim 6, in which said discharging circuit means further includes a switch connected with the anode of said diode and operable to be electrically non-conductive when said control signal exists and electrically conductive when said control signal ceases.

8. A device according to claim 7, in which said switch is constituted by a transistor.

9. A device according to claim 7, in which said switch is constituted by a unidirectional tetrode thyristor.

10. A device according to claim 5, in which said cutoff signal generating means is constituted by a diode having its anode connected with the cathode of said thyristor and its cathode connected with said gate of said thyristor, and said discharging means further includes a switch connected with the cathode of said diode and operable to be electrically non-conductive when said control signal exists and electrically conductive when said control signal ceases.

11. A device according to claim 10, in which said switch is constituted by a transistor.

12. A device according to claim 10, in which said switch is constituted by a second unidirectional thyristor.

13. A device according to claim 5, further comprising means for selectively applying said external control signal to said gate of said thyristor for a charging operation and to said switch for a discharging operation.

* * * * *